(12) United States Patent
Zheng et al.

(10) Patent No.: US 8,059,411 B2
(45) Date of Patent: Nov. 15, 2011

(54) VEHICULAR ELECTRONICS ASSEMBLY

(75) Inventors: Yunqi Zheng, Torrance, CA (US); John E. Proulx, Laguna Niguel, CA (US)

(73) Assignee: GM Global Technology Operations LLC, Detroit, MI (US)

(*) Notice: Subject to any disclaimer, the term of this patent is extended or adjusted under 35 U.S.C. 154(b) by 156 days.

(21) Appl. No.: 12/511,889

(22) Filed: Jul. 29, 2009

(65) Prior Publication Data
US 2011/0026226 A1 Feb. 3, 2011

(51) Int. Cl.
*H05K 7/20* (2006.01)
*H01L 23/28* (2006.01)

(52) U.S. Cl. ........ 361/720; 361/679.53; 361/679.54; 361/702; 361/704; 361/719; 165/104.33; 165/185; 174/16.3; 174/521; 174/523; 174/547; 174/548; 363/141

(58) Field of Classification Search ........ 361/679.54, 361/704, 707, 709, 719, 679.53, 702, 720; 174/16.3, 521, 523, 526, 547–548; 165/185; 363/141
See application file for complete search history.

(56) References Cited

U.S. PATENT DOCUMENTS

| | | | | |
|---|---|---|---|---|
| 4,109,294 A * | 8/1978 | Mason et al. | ........ | 361/752 |
| 4,172,272 A * | 10/1979 | Schneider | ........ | 361/717 |
| 4,979,074 A * | 12/1990 | Morley et al. | ........ | 361/720 |
| 5,054,193 A * | 10/1991 | Ohms et al. | ........ | 29/840 |
| 5,060,114 A * | 10/1991 | Feinberg et al. | ........ | 361/706 |
| 5,381,304 A * | 1/1995 | Theroux et al. | ........ | 361/706 |
| 5,519,252 A * | 5/1996 | Soyano et al. | ........ | 257/690 |
| 5,820,983 A * | 10/1998 | Curtin | ........ | 425/388 |
| 6,093,249 A * | 7/2000 | Curtin | ........ | 118/500 |
| 6,239,359 B1 * | 5/2001 | Lilienthal et al. | ........ | 174/370 |
| 6,317,324 B1 * | 11/2001 | Chen et al. | ........ | 361/704 |
| 6,549,409 B1 * | 4/2003 | Saxelby et al. | ........ | 361/704 |
| 2006/0120054 A1 * | 6/2006 | Buschke | ........ | 361/707 |

FOREIGN PATENT DOCUMENTS
JP 05110268 A * 4/1993
* cited by examiner

*Primary Examiner* — Robert J Hoffberg
(74) *Attorney, Agent, or Firm* — Ingrassia Fisher & Lorenz P.C.

(57) ABSTRACT

An electronics assembly for use in a vehicle is provided. The assembly comprises a heat sink, a dam coupled to the heat sink, the dam and the heat sink combining to form a reservoir, an electronic component positioned within the reservoir, and a thermally conductive layer conformally molded to the electronic component and disposed between the electronic component and the heat sink.

11 Claims, 3 Drawing Sheets

VEHICULAR ELECTRONICS ASSEMBLY

TECHNICAL FIELD

The present invention generally relates to vehicular electronics assemblies, and more particularly relates to a thermal interface for a vehicular power inverter assembly and to methods for fabricating such an assembly.

BACKGROUND OF THE INVENTION

Electric and hybrid electric vehicles often use sources of high voltage such as battery packs or fuel cells that deliver direct current (DC) to drive vehicle motors, electric traction systems (ETS), and other vehicle systems. A power inverter is typically used to convert the source DC signal to an alternating current (AC) signal which is directed to, for example, an electric traction machine or other AC system. Because such systems often use a significant amount of power, many of the components within the inverter including integrated gate bipolar transistor (IGBT) modules and power diodes may generate considerable heat. Accordingly, other accompanying components within the inverter such as, for example, gate drive circuit boards are often exposed to elevated temperatures especially during periods of peak power demand.

Because the performance characteristics of many electronic components can be affected by high temperatures, power inverters generally include a cooling system to dissipate heat. Such a cooling system typically includes a heat sink having a large thermal mass that may assume the form of a manifold thermally coupled to the primary cooling system of the vehicle and configured to cool individual components. For example, the gate drive circuit board is typically thermally coupled to the surface of the heat sink through a pre-formed, resilient, thermal interfacing pad positioned between the board and the heat sink. The circuit board is then typically fastened to the heat sink against the resilience of the underlying pad to secure the board and improve thermal contact by compressing the pad. In this case, however, heat transfer may be hindered because of a lack of conformity between the pad and the often highly irregular surface of the board.

Accordingly, it is desirable to provide an electronics assembly for a vehicle having a thermal interface that provides improved heat transfer and vibration dampening to electronic components such as circuit boards. Further, it is also desirable if such an assembly reduces circuit board deflection and part count, and is simpler to fabricate. Furthermore, it is also desirable to provide methods for fabricating such an assembly. Furthermore, other desirable features and characteristics of the present invention will become apparent from the subsequent detailed description and the appended claims, taken in conjunction with the accompanying drawings and the foregoing technical field and background.

SUMMARY OF THE INVENTION

According to various embodiments, an electronics assembly for use in a vehicle is provided. The assembly comprises a heat sink, a dam coupled to the heat sink, the dam and the heat sink combining to form a reservoir, an electronic component positioned within the reservoir, and a thermally conductive layer conformally molded to the electronic component and disposed between the electronic component and the heat sink.

Methods are provided for fabricating an electronics assembly, the assembly including a heat sink having a surface. In accordance with an exemplary embodiment of the invention, one method comprises coupling a dam to the surface of the heat sink, the dam and the surface of the heat sink combining to form a reservoir, and depositing a circuit board in the reservoir. The method also comprises dispensing a curable material in the reservoir and between the surface of the heat sink and the circuit board, and curing the curable material.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The various embodiments of the present invention described herein provide an electronics assembly for a vehicle and methods for fabricating such an assembly. The assembly includes a dam coupled to a surface of a heat sink, and an electronic component such as, for example, a circuit board positioned within a reservoir formed by the heat sink surface and the dam. A thermally conductive interfacing layer is conformally molded between the circuit board and the surface of the heat sink by dispensing a curable material into the reservoir and between the board and the surface of the heat sink, and curing the curable material. The resulting interfacing layer is conformally molded to irregularities in the board including those associated with other electronic components, solder connections, and the like. Accordingly, the conformality of engagement improves thermal contact and heat transfer between the board and the heat sink without compressing the board against the interfacing layer potentially causing the board to become deflected. Further, because of its elastomeric characteristics, the interfacing layer provides energy absorption, dampening vibrations that might otherwise be transferred more directly to electronic components and associated connections on the board.

Figure 1:
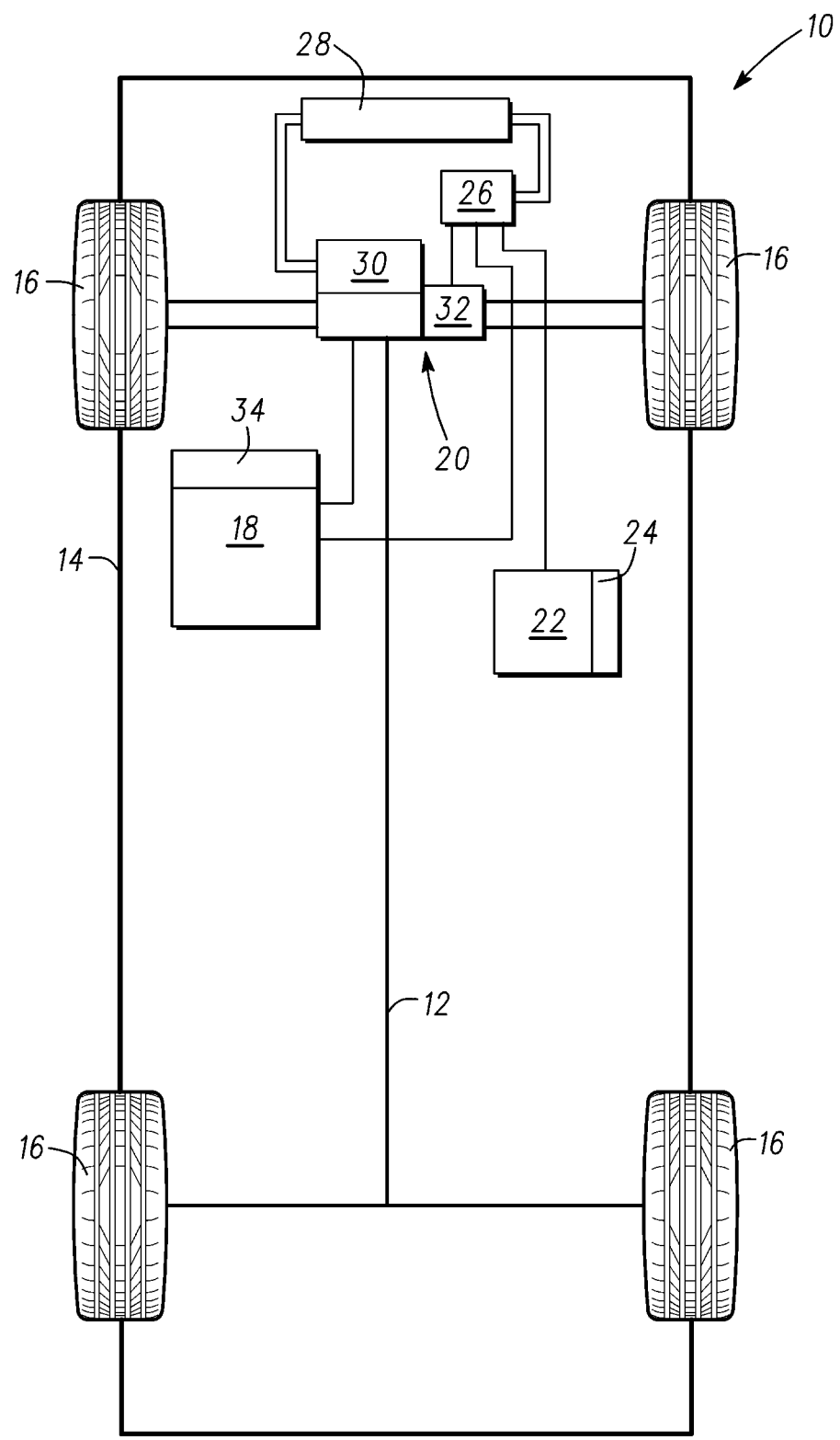
FIG. 1 is a schematic view of an exemplary vehicle illustrating a manner in which a power inverter is integrated with various sub-components of the vehicle, in accordance with an exemplary embodiment.

FIG. 1 is a schematic diagram of an exemplary vehicle 10 in accordance with an exemplary embodiment of the present invention. Vehicle 10 includes a chassis 12, a body 14, four wheels 16, and an electronic control system (or electronic control unit (ECU)) 18. The body 14 is arranged on the chassis 12 and substantially encloses the other components of vehicle 10. The body 14 and the chassis 12 may jointly form a frame. The wheels 16 are each rotationally coupled to the chassis 12 near a respective corner of body 14.

Vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). Vehicle 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/electric motor hybrid engine, and an electric motor.

In the exemplary embodiment illustrated in FIG. 1, vehicle 10 is a hybrid vehicle that further includes an actuator assembly (or powertrain) 20, a battery (or DC source) assembly 22, a battery state of charge (SOC) system 24, a power inverter assembly 26, and a radiator 28. Battery assembly 22 is electrically coupled to various electrical components including power inverter assembly 26 using cabling and/or busbars. Actuator assembly 20 includes an internal combustion engine 30 and an electric motor/generator (or motor) system (or assembly) 32. In one embodiment, battery assembly 22 includes a lithium ion (Li-ion) battery including any number of cells, as is commonly used. ECU 18 may also include a variable motor drive module 34 configured to control various vehicular functions including but not limited to electric motor torque and speed.

Power inverter assembly 26 includes capacitor and IGBT modules (not illustrated) as well as a plurality of conductors and electronic elements. Power inverter 26 is configured with access to a heat sink such as a manifold in fluid communication with radiator 28, or a thermally conductive mass for dissipating heat generated therein. Inverter assembly 26 also includes other electronics assemblies such as a gate drive circuit board assembly that includes a thermal interface between the board and the heat sink configured to facilitate heat transfer therebetween. As will be described more fully below, the interface includes a thermally conductive interfacing layer conformally molded to the gate drive circuit board to provide efficient heat transfer without causing the board to be subjected to stresses that may result in deflection. The interfacing layer also absorbs and dampens vibrations that might otherwise be transferred to electronic components and connections associated with the board, and provides a moisture resistant environmental seal for these components.

Figure 2:
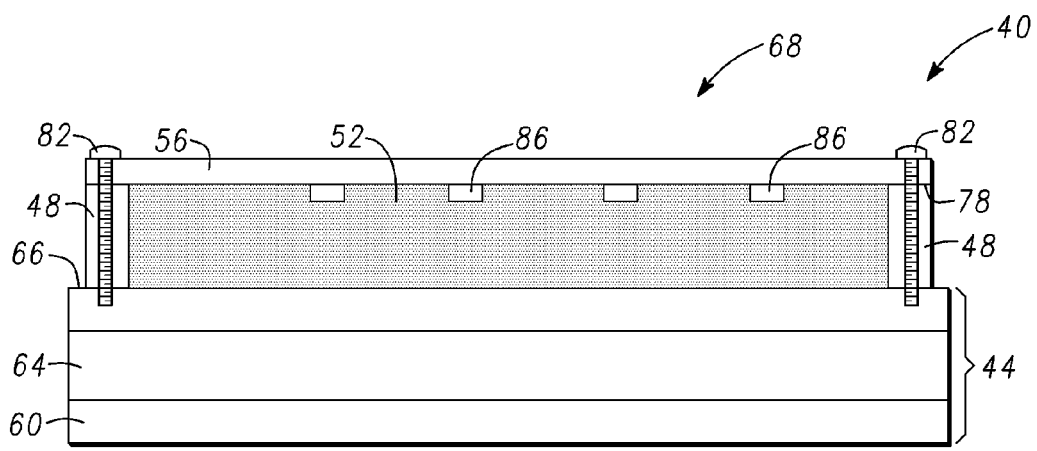
FIG. 2 is a cross-sectional view of an electronics assembly of a type suitable for deployment in the power inverter depicted in FIG. 1, in accordance with an exemplary embodiment.

FIG. 2 is a cross-sectional view of an electronics assembly 40 of a type suitable for deployment in power inverter assembly 26 (FIG. 1), in accordance with a first exemplary embodiment. Assembly 40 includes a heat sink 44, a dam 48, a thermal interfacing layer 52, and a circuit board 56. While this embodiment is described herein and illustrated in FIG. 2 in the context of a circuit board, it is understood that any electronic component for which cooling is desirable may be substituted for board 56. Heat sink 44 may assume any configuration suitable as a heat sink such as that of a thermally conductive jacket or manifold 60 having a hollow cavity 64 wherein a vehicular coolant may flow. Alternatively and more simply, heat sink 44 may be a thermally conductive element having a thermal mass sufficient for use as a heat sink. Dam 48 is coupled to a surface 66 of heat sink 44, and is configured to form a substantially closed loop with itself that, together with surface 66, forms a reservoir 68. Dam 48 may be constructed from an electrically insulating, durable, and preferably thermally conductive material such as, for example, a suitable thermoplastic or thermosetting polymeric (plastic) material.

Reservoir 68 contains circuit board 56 therein in any suitable manner. For example, in one embodiment (not illustrated), circuit board 56 resides in reservoir 68 on surface 66. In another embodiment (as illustrated), circuit board 56 is positioned in reservoir 68 via coupling to an upper edge 78 of dam 48. Board 56 may be conventionally secured to dam 48 and heat sink 44 using bolts 82 or any other suitable fasteners. Thermal interfacing layer 52 is disposed in reservoir 68 and between circuit board 56 and surface 66, and provides a thermally conductive heat transfer pathway between these two elements. In one embodiment, interfacing layer 52 is conformally molded to circuit board 56 and is coupled to surface 66. In another embodiment, interfacing layer 52 is conformally molded to both circuit board 56 and surface 66.

As used herein, the term "conformally molded" as used in the context of thermal interfacing layer 52 means that layer 52 is formed or molded to board 56 when in a fluid state, and thus assumes intimate contact with the surface features thereof including irregularities and any sub-components 86 coupled thereto. Layer 52 includes a material that, when cured, forms a thermally conducting layer having elastomeric properties at normal operating temperatures. Prior to curing, layer 52 exists in a sufficiently fluid state such as, for example, as a liquid or gel that may be dispensed into reservoir 68 between surface 66 and board 56. Accordingly, these surfaces, including any irregularities therein, create a mold into which layer 52 flows conforming to such irregularities. When cured, an intimate physical and thermal contact between surface 66 and board 56 is formed due at least in part to such conformal molding. Layer 52 may be made from any suitable curable material that when cured results in a low $T_g$ (glass transition temperature) elastomer. In one embodiment, layer 52 comprises a curable silicone rubber such as, for example, THERM-A-GAP™ (manufactured by Parker Chomerics, Cleveland Ohio), or R-2930 (Manufactured by Nusil Technology, Carpenteria, Calif.). As used herein, the term "curing" in the context of layer 52 may involve either a reactive mechanism that results in a more solidified material such as, for example, a via crosslinking of polymer chains, or a non-reactive mechanism whereby solvents are removed such as, for example, by evaporation, or a combination of these.

During operation, the temperature of circuit board 56 and/or sub-components 86 may rise due to heat generation from sources internal or external to inverter assembly 26 (FIG. 1). At least a portion of this heat is transferred from circuit board 56 to heat sink 44 through thermal interface layer 52. The conformal molding of layer 52 to circuit board 56 provides a more efficient thermal contact between these two elements than previous pad-based designs, and thus increases heat transfer and cooling of board 56. Accordingly, because such contact with interfacing layer 52 is achieved without the need to compressively fasten board 56 thereto, deflection of board 56 is reduced. Further, layer 52 adhesively bonds to board 56 and helps to provide environmental protection to sub-components 86 and associated solder connections by inhibiting the ingression of moisture to these electronic elements. As described above, because layer 52 is made from a low $T_g$ elastomeric material, vibrational energy that might otherwise be transferred more directly to board 56 and/or sub-components 86 and associated interconnections is absorbed and dampened by layer 52.

Figure 3:
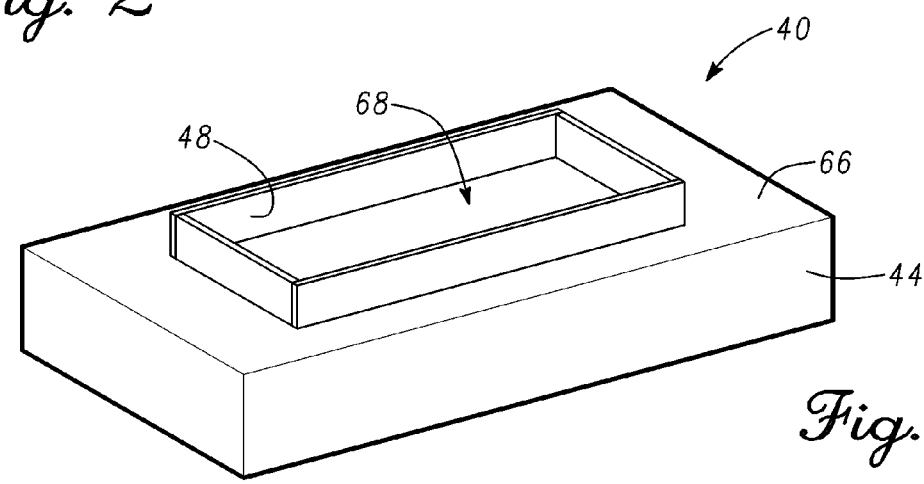
FIG. 3 is an isometric view of the electronics assembly depicted in FIG. 2, in accordance with an exemplary embodiment.

FIG. 3 is a cross-sectional view of electronics assembly 40, in accordance with the exemplary embodiment. Certain elements of assembly 40, most notably interfacing layer 52 and a circuit board 56, have been omitted to more clearly represent the relationship between heat sink 44 and dam 48. Dam 48 is a walled structure substantially closed upon itself that forms, in combination with surface 66, reservoir 68. While dam 48 is illustrated as having a substantially rectangular shape, it is understood that dam 48 may have any shape and size such that reservoir 68 compatibly contains at least a portion of circuit board 56 (FIG. 2). For example, dam 48 may assume the shape of a polygon having a plurality of substantially straight segments, or may be substantially circular or elliptical, or may include a combination of straight and curved segments. In one embodiment, dam 48 resides on surface 66. Dam 48 is used as a peripheral boundary for containment of a curable material within reservoir 68 that, when cured, forms interfacing layer 52 (FIG. 2).

Figure 4:
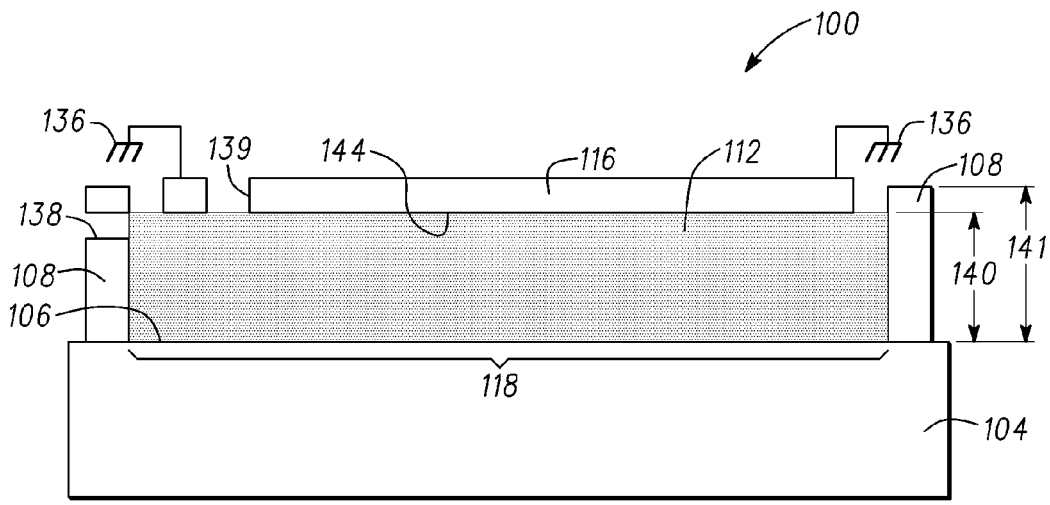
FIG. 4 is a cross-sectional view of an electronics assembly of a type suitable for deployment in the power inverter depicted in FIG. 1, in accordance with another exemplary embodiment.

FIG. 4 is a cross-sectional view of an electronics assembly 100 of a type suitable for deployment in power inverter 26 (FIG. 1), in accordance with another exemplary embodiment. Assembly 100 includes a heat sink 104 having a surface 106, a dam 108, a thermal interfacing layer 112, and a circuit board 116. Dam 108 is a coverless/bottomless walled enclosure suitably sealed against surface 106 and configured to retain a liquid or gel within a reservoir 118. Circuit board 116 is positioned within reservoir 118 and is substantially circumscribed by dam 108, and may have any number of components and/or solder connections (not illustrated). Circuit board 116 is coupled to at least one retention element 136 configured to mechanically secure board 116 in place within reservoir 118. Element 136 may be any type of retaining device such as, for example, a support bracket, or may be an electrical interconnecting element such as, for example, an electrical connector or cable. Element 136 may retain circuit board 116 within reservoir 118 any distance from dam 108. In one embodiment (not illustrated), board 116 resides on surface 106. In another embodiment (as illustrated), board 116 is retained in place above surface 106 by a distance (represented by double headed arrow 140) that depends, at least partially, upon the desired thickness of layer 112. The height of dam 108 (as represented by double headed arrow 141) is adjusted accordingly so as to be sufficient to retain thermal interfacing layer 112. Layer 112 resides in reservoir 118 between circuit board 116 and surface 106. In one embodiment, layer 112 is conformally molded to a surface 144 of circuit board 116. In another embodiment, layer 112 is also conformally molded to surface 106. In a further embodiment, dam 108 includes a port 138 configured to provide access through which interfacing layer 112 may be dispensed when in a gel or liquid state. In yet a further embodiment, board 116 includes a port 139 suited to this purpose.

During operation, heat within circuit board 116 is transferred through interfacing layer 112 and is dissipated by heat sink 104. The conformal molding of layer 112 to circuit board 116 provides intimate physical and thermal contact between these elements, as previously described. In addition, such conformal molding also provides retentive support to board 116, further alleviating a need for fasteners that may unevenly impart stress to board 116 causing deflection. Accordingly, such decreased deflection also reduces the accompanying strain imposed upon other sub-components and/or associated solder interconnections. Further, layer 112 adhesively bonds to surface 144 of board 116 helping to prevent the ingression of moisture along this interface and providing retentive support securing board 116 to surface 106. Furthermore, layer 112 absorbs and dampens vibrations and/or shocks that might otherwise be transferred to board 116 when conventionally tightened against a resilient pad-type layer. By reducing the amplitude of these vibrations, cyclic stresses of the type that potentially lead to fatigue-related failures in sub-components and solder connections is decreased. Fabrication of the assembly also is simplified because the adhesive bonding of layer 112 between board 116 and surface 106 provides retentive support for board 116 and thereby at least partially alleviates the need for fasteners used for this purpose.

Figure 5:
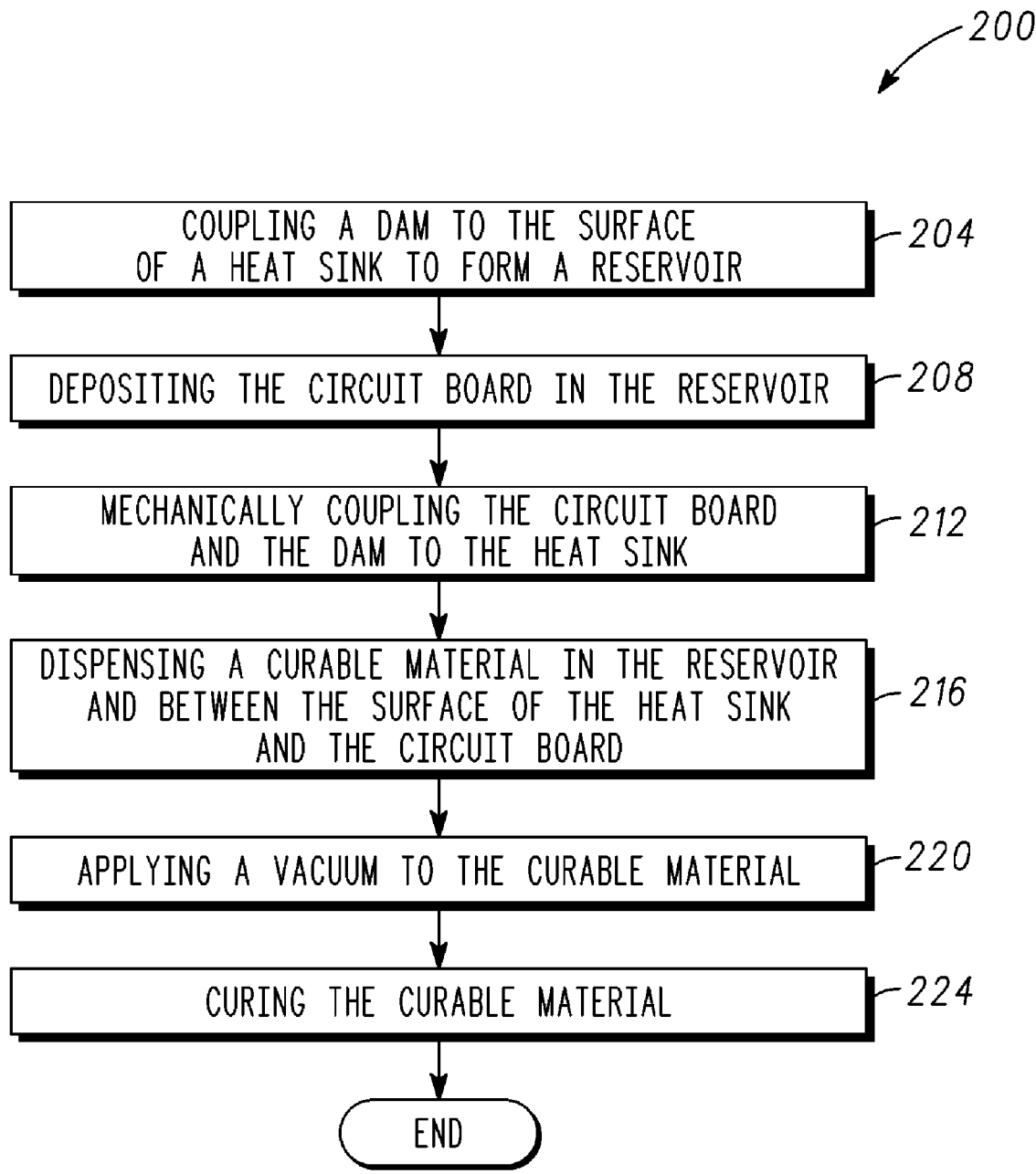
FIG. 5 is a block diagram illustrating a method of fabricating an electronics assembly having a thermal interface of the type illustrated in FIGS. 2-4, in accordance with a further exemplary embodiment.

FIG. 5 is a block flow diagram illustrating a method 200 of fabricating an electronics assembly having a thermal interface of the type previously described and illustrated in FIGS. 2-4, in accordance with an exemplary embodiment. Method 200 begins when a dam is coupled to a surface of a heat sink (step 204). The dam may be positioned in direct contact with the heat sink surface or, alternatively, may be positioned on another surface in thermal communication with the heat sink surface. The dam in combination with the surface of the heat sink forms a reservoir. A circuit board then is deposited in the reservoir (step 208). The circuit board may reside on the surface of the heat sink or, may be suspended within the reservoir by any type of retaining or connecting element, and/or may be coupled to the dam. The circuit board then is mechanically coupled along with the dam to the heat sink (step 212). Mechanical coupling may be performed using suitable fasteners or, alternatively, may be performed using the retaining or connecting elements described above with reference to FIG. 4 provided these sufficiently secure the board in the reservoir. Next, a curable material is dispensed in the reservoir and between the surface of the heat sink and the circuit board (step 216). The dam, heat sink surface, and board thereby act as a mold for the curable material which is allowed to flow between surfaces of these elements. A vacuum then is applied to the curable material (step 220). The vacuum withdraws air bubbles and/or pockets that may have become trapped in the curable material or between the curable material and the circuit board during the dispensing step (step 216), enabling improved physical and thermal contact between the curable material and the circuit board. The curable material then is cured using a suitable process that may include baking at elevated temperatures and/or exposure to radiation such as, for example, ultraviolet radiation to form a conductive, elastomeric, thermal interfacing layer (step 224).

While method 200 has been described above and illustrated in FIG. 5 in accordance with one embodiment, it should be understood that other variations of this method are possible. For example, in one embodiment, the dam is configured to have a port, and the curable material is dispensed into the port. Alternatively, the curable material may be dispensed into any suitable opening between the dam and circuit board, or through a port in the circuit board itself if the board is so configured. Further, certain steps described above with reference to method 200 may be omitted. For example, the fabrication of an electronics assembly having a thermal interface may be performed by the steps of coupling a dam to a surface of the heat sink (step 204), depositing a circuit board in a reservoir formed by the dam (step 208), dispensing a curable material in the reservoir and between the surface of the heat sink and the circuit board (step 216), and curing the curable material (step 224), while omitting the step of mechanically coupling (step 212) and/or applying a vacuum (step 220).

The various embodiments of the present invention described herein provide an electronics assembly for a vehicle having a thermal interface that provides improved heat transfer and vibration/shock dampening to electronic components such as a circuit board, and methods for fabricating such an assembly. A dam configured to retain a curable material is physically coupled to a surface of a heat sink, and a circuit board is deposited within a reservoir formed by the dam and the heat sink surface. The curable material is dispensed within the reservoir and flows between the surface of the heat sink and the circuit board. When cured, the curable material forms an electrically insulating, and thermally conducting elastomeric thermal interfacing layer conformally molded to the circuit board and having intimate physical and thermal contact therewith. Because intimate physical and thermal contact with the circuit board is achieved without forceful compression of the board against the interfacing layer, deflection of the board is reduced along with concomitant stress imparted to components and associated connections thereon. Further, because fewer fasteners are needed, overall part count may be reduced simplifying fabrication of the assembly.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electronics assembly for use in a vehicle, the assembly comprising:
    a heat sink;
    a dam coupled to the heat sink forming a reservoir;
    a circuit board positioned within the reservoir without being supported by the dam or the heat sink;
    a thermally conductive layer conformally molded to the circuit board and disposed between the circuit board and the heat sink; and
    a port in the circuit board configured to enable the thermally conductive layer to be dispensed through.

2. An assembly according to claim 1, wherein the thermally conductive layer comprises a curable elastomer.

3. An assembly according to claim 2, wherein the thermally conductive layer comprises a curable silicone rubber.

4. An assembly according to claim 1, wherein the dam comprises an electrically insulating material.

5. An assembly according to claim 4, wherein the dam comprises a polymeric material.

6. An assembly according to claim 1, wherein the heat sink comprises a surface, and wherein the dam resides on the surface of the heat sink.

7. An assembly according to claim 1, wherein the heat sink defines a hollow cavity for allowing flow of coolant through the heat sink.

8. A method for fabricating an electronics assembly, the assembly including a heat sink having a surface, the method comprising the steps of:
    coupling a dam to the surface of the heat sink to form a reservoir;
    depositing a circuit board defining a port in the reservoir without supporting the circuit board with the dam or the heat sink;
    dispensing a curable material in the reservoir through the port and between the surface of the heat sink and the circuit board; and
    curing the curable material.

9. A method according to claim 8, wherein the step of dispensing a curable material comprises dispensing a curable material that is elastomeric when cured.

10. A method according to claim 8, further comprising the step of applying a vacuum to the curable material.

11. A method according to claim 8, wherein the step of curing comprises heat curing.

* * * * *